United States Patent
Grewing et al.

(10) Patent No.: US 7,180,385 B2
(45) Date of Patent: Feb. 20, 2007

(54) DIRECT FREQUENCY MODULATION SYSTEM HAVING AN IQ MIXER IN THE PHASE LOCKED LOOP

(75) Inventors: Christian Grewing, Sollentuna (SE); Markus Hammes, Dinslaken (DE); André Hanke, Düsseldorf (DE); Stefan Van Waasen, Sollentuna (SE)

(73) Assignee: Infineon Technologies AG, Munich (DE)

( * ) Notice: Subject to any disclaimer, the term of this patent is extended or adjusted under 35 U.S.C. 154(b) by 154 days.

(21) Appl. No.: 10/939,587

(22) Filed: Sep. 13, 2004

(65) Prior Publication Data

US 2005/0275481 A1 Dec. 15, 2005

Related U.S. Application Data

(63) Continuation of application No. PCT/DE03/00773, filed on Mar. 11, 2003.

(30) Foreign Application Priority Data

Mar. 14, 2002 (DE) ............................. 102 11 381

(51) Int. Cl.
*H03C 3/06* (2006.01)
(52) U.S. Cl. ......................................... 332/128; 331/23
(58) Field of Classification Search ................. 332/128, 332/127; 311/23
See application file for complete search history.

(56) References Cited

U.S. PATENT DOCUMENTS 4,449,250 A    5/1984   Kurby
4,481,489 A *  11/1984  Kurby ........................ 332/119
4,994,768 A    2/1991   Shepherd et al.
6,356,597 B1 * 3/2002   Jackson et al. ............. 375/308
6,774,740 B1 * 8/2004   Groe .......................... 332/103

FOREIGN PATENT DOCUMENTS

DE    199 29 167 A1   12/2000
EP    1 063 766 A2    12/2000
WO    WO 95/16304 A1  6/1995

OTHER PUBLICATIONS

Chapter 7 "More Complex Configurations", *Frequency Synthesis by Phase Lock*, W. F. Egan, John Wiley & Sons, 1981, ISBN 0-471-08202-3, pp. 168-204.

* cited by examiner

*Primary Examiner*—Joseph Chang
(74) *Attorney, Agent, or Firm*—Eschweiler & Associates, LLC

(57) ABSTRACT

A transmission arrangement includes a step-up frequency mixer that converts a modulation signal to a transmission frequency. The step-up frequency mixer is arranged within a phase locked loop that further comprises a frequency divider that is likewise supplied with the modulation data, combined with channel pre-selection data, for the purposes of compensation. This arrangement prevents low-frequency components of the modulation signal from being eliminated by the phase locked loop. In addition, noise components and undesirable interference frequency components that are produced in the mixer are suppressed by the phase locked loop.

14 Claims, 1 Drawing Sheet

DIRECT FREQUENCY MODULATION SYSTEM HAVING AN IQ MIXER IN THE PHASE LOCKED LOOP

REFERENCE TO RELATED APPLICATIONS

This application is a continuation of PCT/DE03/00773 filed Mar. 11, 2003 which was not published in English, that claims the benefit of the priority date of German Patent Application No. DE 102 11 381.5, filed on Mar. 14, 2002, the contents of which both are herein incorporated by reference in their entirety.

FIELD OF THE INVENTION

The present invention relates to a transmission arrangement for frequency modulation.

BACKGROUND OF THE INVENTION

An IQ modulator or quadrature modulator in the form of a vector modulator is normally used to modulate a carrier frequency in a transmission arrangement using a frequency modulation method. In this case, the actual transmission signal containing the modulation data is usually produced, during digital signal processing, at an intermediate frequency which is low or disappears. Corresponding transmission structures are referred to as low IF or zero IF transmitters. In this case, IF is an abbreviation for intermediate frequency. The IQ mixer in the form of a double-balanced mixer is used to step up this modulated signal (in the form of a single-sideband signal) to the desired carrier frequency. In a quadrature modulator of this type, both the modulation signal containing the actual modulation data and the carrier signal must be broken down into quadrature components. Quadrature components are also referred to as IQ components. In this case, the in-phase and quadrature components are orthogonal to one another and form a complex signal.

A control loop in the form of a phase locked loop (PLL) is usually provided in the transmission architecture for the purpose of controlling the transmission frequency. A PLL of this type comprises, for example, a phase detector, a loop filter, a charge pump, a voltage-controlled oscillator and a frequency divider, which are appropriately interconnected. The unmodulated carrier signal, rather than the modulated output signal from the transmission arrangement, is normally fed to the phase locked loop for frequency control in order to prevent low-frequency components of the modulation signal from being eliminated by the phase locked loop.

However, the principle described has the disadvantage that, when modulating a frequency component before the frequency of the oscillator signal is converted to the transmission frequency, only an unmodulated frequency component, and therefore not the final frequency or output frequency of the transmitter, can be fed to the phase locked loop.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a transmission arrangement in which low-frequency modulation components are taken into account in the phase control system in order to prevent the transmitter's channel frequency from drifting and which, at the same time, has good noise characteristics.

The transmission arrangement for frequency modulation of the present invention comprises a first input connection configured to supply modulation data, and a second input connection configured to supply a channel pre-selection signal. The arrangement further comprises a step-up frequency mixer having a first input, which is coupled to the first input connection, configured to supply modulation data, and a linking element having two inputs, which are coupled to the first and second connections of the transmission arrangement, and an output.

Still further, the arrangement includes a phase locked loop that comprises an oscillator having a control input configured to control the output frequency, and an output that is connected to a second input of the step-up frequency mixer. The phase locked loop includes the step-up frequency mixer, and also includes a feedback path that is connected to an output of the step-up frequency mixer and to an input of a phase comparator. The phase locked loop also comprises a frequency divider having a control input that is coupled to the output of the linking element, and the phase comparator has an output that is coupled to the control input of the oscillator.

In accordance with the present invention, the modulated transmission signal that is produced at the output of the step-up frequency mixer is fed to the phase locked loop. The channel frequency is thus prevented from drifting on account of low-frequency components in the modulation signal, since a compensation facility is formed by the modulation data being supplied not only to the step-up frequency mixer but also to the frequency divider in the feedback path of the control loop. As in a conventional transmission arrangement, the frequency divider, in conjunction with the phase locked loop, additionally pre-selects the transmitter's channel by likewise being supplied with the channel pre-selection signal.

One exemplary aspect of the present invention is, inter alia, that the step-up frequency mixer, which operates as a modulator, is also included in the control loop, so that noise components and interference frequency components that are produced in the step-up frequency mixer and are undesirable are largely attenuated.

The phase locked loop is advantageously used to eliminate, in particular, those interference frequency components that are close to the carrier frequency and are thus difficult to suppress using filter arrangements. The transmission arrangement described is distinguished by low power consumption and good noise characteristics.

The frequency divider is advantageously in the form of a fractional-N frequency divider in order to take account of radio-frequency components of the modulation signal. Fractional-N frequency dividers use not only integer values but also fractions (which can be set as desired) to divide the feedback signal in the control loop.

The step-up frequency mixer is advantageously in the form of an IQ mixer that is designed to process a complex modulation signal. A complex modulation signal is a signal that has been broken down into an in-phase component and a quadrature component which is orthogonal to the latter.

In one example, the IQ mixer comprises a vector modulator.

Since the modulation frequency shift in an IQ mixer or vector modulator does not depend on process fluctuations during the production of integrated circuits, there is no need, in accordance with the present invention, to adjust the modulation compensation in the phase locked loop.

The modulation data may preferably be in the form of digitally coded data which is to be transmitted. In accordance with one preferred development of the present invention, a digital/analog converter may be used to first of all convert the digital modulation signal to a corresponding analog signal. A low-pass filter which acts as an anti-aliasing filter with respect to the step-up frequency mixer connected to the output of the low-pass filter is advantageously connected downstream of the DA converter.

A digital frequency modulator which, as a function of modulation data applied to its input, provides a digitally coded frequency-modulated signal at its output is preferably provided for the purpose of coupling the modulation data input connection to the digital input of the D/A converter.

A digital delta-sigma modulator is preferably connected between the output of the linking element and the control input of the frequency divider. The phase locked loop, in conjunction with the preferred design of the frequency divider as a fractional-N divider, is thus advantageously developed to form a delta-sigma fractional-N PLL.

As an alternative to the advantageous refinements of the invention that have been described, the transmission arrangement in accordance with the present invention may also have an intermediate-frequency transmission architecture. In this case, the oscillator in the phase locked loop does not produce a signal at the transmission frequency, but a signal at a frequency that produces just the desired transmission frequency when mixed with the intermediate frequency.

BRIEF DESCRIPTION OF THE DRAWINGS

The invention is explained in more detail below using one exemplary embodiment and with reference to the single FIGURE, in which.

DETAILED DESCRIPTION OF THE INVENTION

Figure 1:
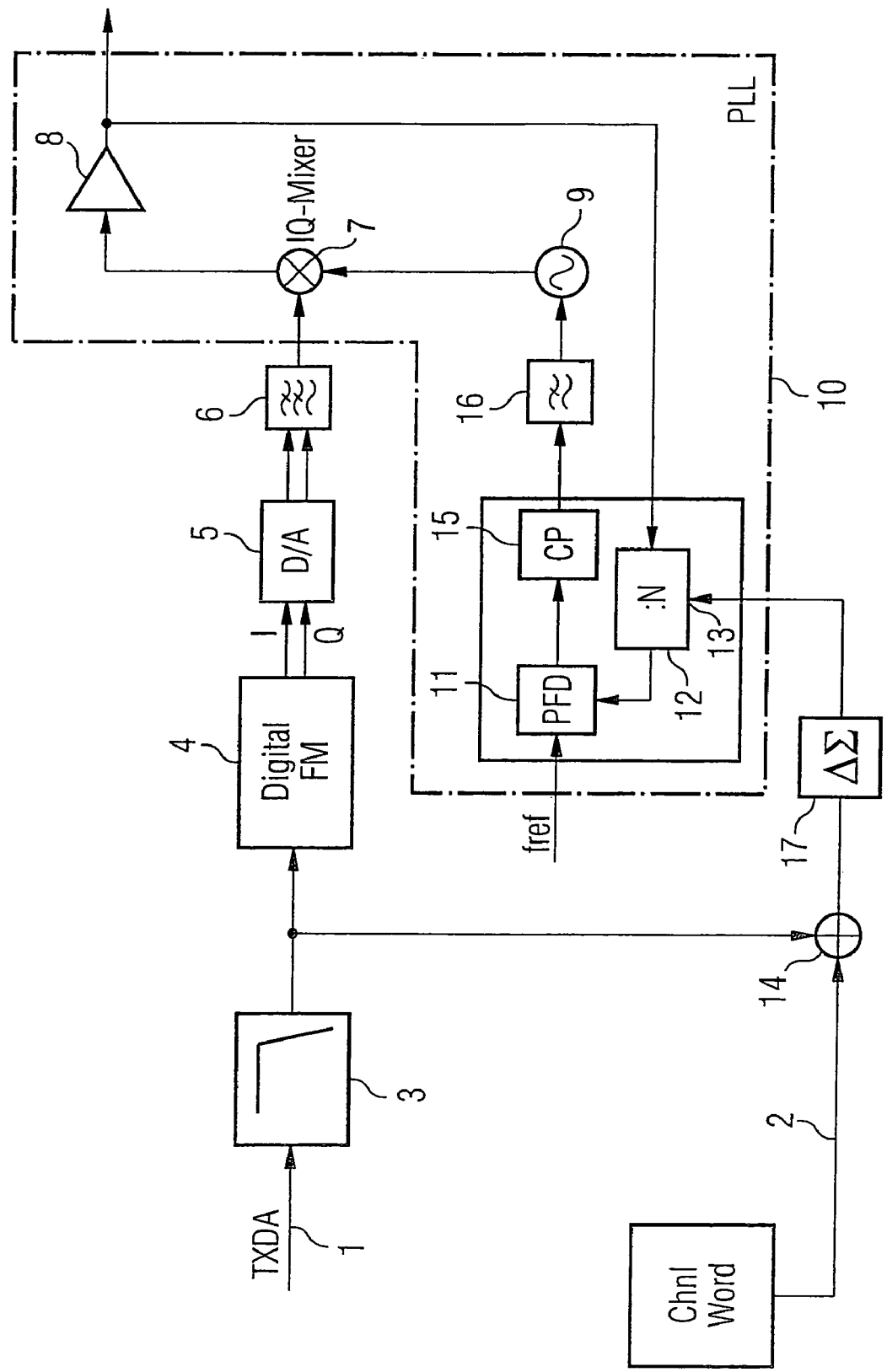
FIG. 1 is a simplified block diagram illustrating one exemplary embodiment of the present invention.

FIG. 1 shows a transmission arrangement that is suited to frequency modulation. Said transmission arrangement comprises a first input connection 1 for supplying modulation data, and a second input connection 2 for supplying a channel pre-selection signal. The two input connections 1, 2 are each designed to supply digitally coded data. A digital filter 3 for conditioning the modulation data is provided at the first input connection 1. A digital frequency modulator 4 whose input is supplied with the conditioned modulation data and at whose output it is possible to tap off a modulation signal (which is derived from the modulation data and is digitally coded) is connected to one output of the digital filter 3. The output of the digital frequency modulator 4 is in the form of a complex output for tapping off orthogonal signal components, and comprises an in-phase output and a quadrature output. These outputs are each connected, via an in-phase signal path I and a quadrature signal path Q, to an input of a respective digital/analog converter 5, with said converters converting the digitally coded modulation signal to a corresponding analog modulation signal.

An anti-aliasing filter 6 is connected to the output of each of the D/A converters 5. The output of the anti-aliasing filter 6 (which is in the form of a low-pass filter) is connected to a first input of a step-up frequency mixer 7 which is in the form of a vector modulator. The anti-aliasing filter 6 may alternatively also be in the form of a bandpass filter or polyphase filter, for example if the transmitter has an intermediate frequency other than zero. A preamplifier 8 whose output forms the output of the transmission arrangement is connected to one output of the IQ mixer 7. A second input of the step-up frequency mixer 7 (which is in the form of an IQ mixer) is connected to the output of a voltage-controlled oscillator 9 that provides a radio-frequency carrier signal (broken down into orthogonal signal components) at the desired transmission frequency.

Both the voltage-controlled oscillator 9 and the IQ mixer 7 are arranged in a phase locked loop 10. This phase locked loop 10 has a feedback path which couples the output of the amplifier 8 and thus the output of the step-up frequency mixer 7 to a first input of a phase detector 11. In this case, the feedback path of the phase locked loop 10 has a frequency divider 12—which is in the form of a fractional-N divider and has a control input 13 to which a frequency division ratio can be supplied in digitally coded form—for the purpose of coupling the amplifier 8 to the phase detector 11.

The control input 13 of the fractional-N frequency divider 12 is connected to the output of a linking element 14 via a sigma-delta modulator 17 which, in alternative designs, may also be omitted. The linking element 14 has two inputs, which are coupled to the first input connection 1 and the second input connection 2 of the transmission arrangement. The linking element 14 therefore combines the modulation data (in the form of digital data) with the channel pre-selection signal (likewise in digital form) and supplies this combined, likewise digitally coded, signal, or a signal derived therefrom, to the control input of the frequency divider 12. A second input of the phase detector 11 is coupled to a reference frequency source (not shown here) for supplying a signal at a reference frequency. The output of the phase detector 11 (which is in the form of a phase and frequency detector) is connected to the control input of the voltage-controlled oscillator 9 via a charge pump circuit 15 and a loop filter 16.

FIG. 1 shows a homodyne direct conversion transmission arrangement, in one example, which is suitable for frequency-modulated signals and has a phase locked loop 10. In this case, the transmission arrangement corresponds to one development of the two-point modulation of a phase locked loop.

In accordance with FIG. 1, modulation data is converted to a modulation signal and supplied to a step-up mixer 7. In addition, the modulation data is also supplied, for the purposes of compensation, to a frequency divider 12 in the feedback path of the PLL 10. In this case, one advantageous feature of the present invention is that the step-up frequency mixer 7 is, in one example, integrated in the phase control system. Noise and interference frequency components which are produced in the mixer 7 can thus advantageously be attenuated in a simple manner provided that they are within the bandwidth of the control loop 10.

Compensation by means of the frequency divider 12 (to which the modulation data is likewise supplied) is used to prevent the channel frequency from drifting on account of low-frequency components of the modulation signal. The vector modulator 7 advantageously does not require any adjustment measures. There is no need to adjust the modulation compensation according to the invention, since the frequency shift in the modulation signal in a vector modulator does not depend on process fluctuations during production of the transmission arrangement.

Since a fractional-N PLL 12, preferably in conjunction with a delta-sigma modulator 17, is usually installed in any case in modern transmission architectures in order to achieve short transient times for the control loop, the invention described herein can be implemented with little additional complexity.

Instead of the exemplary direct conversion design shown herein, the present invention may also be applied, within the scope of the invention, to heterodyne transmission architectures that operate at an intermediate frequency level of, for example, a few hundred MHz. The invention described may likewise be used in low IF and zero IF transmission structures.

Frequency modulation may preferably be carried out in an analogous manner at an intermediate frequency of, for example, a few hundred Megahertz in order to avoid the need for digital/analog converters designed for radio-frequency signals.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

The invention claimed is:

1. A frequency modulation system, comprising:
a first input connection configured to supply modulation data;
a second input connection configured to supply a channel pre-selection signal;
a linking element comprising two inputs coupled to the first and second input connections of the frequency modulation system, and an output, and configured to provide a division control signal that is a function of the modulation data and the pre-selection signal; and
a phase locked loop, comprising:
an oscillator having a control input configured to control an output carrier frequency signal of the oscillator, and an output providing the output carrier frequency signal;
a step-up frequency mixer comprising a first input coupled to the first input connection and configured to receive the modulation data, and a second input coupled to the output of the oscillator, wherein the step-up frequency mixer is configured to output a modulation signal at a transmission frequency that is a function of the modulation data and the output carrier frequency signal;
a phase comparator configured to compare a reference frequency signal to a feedback frequency signal that is a function of the transmission frequency modulation signal, and having an output coupled to the control input of the oscillator, wherein the phase comparator is configured to compare the reference frequency signal and the feedback frequency signal and output a control signal in response thereto at an the output thereof to control the output carrier frequency of the oscillator; and
a feedback path connected to an output of the step-up frequency mixer and to an input of the phase comparator, the feedback path comprising a frequency divider having a control input coupled to the output of the linking element, wherein the frequency divider is configured to divide down the transmission frequency modulation signal based on the division control signal to produce the feedback frequency signal.

2. The transmission arrangement as claimed in claim 1, wherein the frequency divider is configured to divide the transmission frequency modulation signal using fractions.

3. The transmission arrangement as claimed in claim 1, wherein the step-up frequency mixer is configured to process a complex modulation signal comprising an in-phase component and a quadrature component.

4. The transmission arrangement as claimed in claim 1, further comprising a digital/analog converter and a downstream low-pass filter operable to couple the first input connection of the frequency modulation system to the first input of the step-up frequency mixer.

5. The transmission arrangement as claimed in claim 4, further comprising a digital frequency modulator configured to produce a frequency-modulated signal as a function of the modulation data at the first input connection and provide the frequency-modulated signal to an input of the digital/analog converter.

6. The transmission arrangement as claimed in claim 1, wherein the phase locked loop further comprises a charge pump circuit and a downstream loop filter configured to couple the phase comparator to the oscillator.

7. The transmission arrangement as claimed in claim 1, further comprising a delta-sigma modulator having an input connected to the output of the linking element, and an output connected to the control input of the frequency divider, wherein the delta-sigma modulator is configured to provide the control signal to the frequency divider based on a combination of the modulation data and the channel pre-selection data provided by the linking element.

8. A frequency modulator, comprising:
a digital frequency modulator configured to receive modulation data and generate a modulation signal in response thereto;
a linking element configured to receive the modulation data and a channel pre-selection signal and output a division control signal as a function thereof;
a phase locked loop, comprising:
a phase detector circuit configured to compare a reference frequency signal and a divided down transmission frequency modulation signal, and output an oscillator control signal in response thereto;

an oscillator circuit configured to generate a carrier frequency signal having a frequency that is a function of the oscillator control signal coupled thereto;

a step-up frequency mixer circuit configured to receive the modulation signal from the digital frequency modulation signal in response thereto; and a divider circuit configured to receive the transmission frequency modulation signal along a feedback path and divide down the transmission frequency modulation signal by a value that is a function of the division control signal.

9. The frequency modulator of claim 8, wherein the modulation signal output from the digital frequency modulator is a digital signal, and further comprising a digital/analog converter configured to convert the digital modulation signal into an analog modulation signal.

10. The frequency modulator of claim 9, further comprising a digital filter at an input of the digital frequency modulator, and configured to digitally filter the modulation data and provide filtered digital modulation data to the digital frequency modulator.

11. The frequency modulator of claim 9, further comprising a filter at an output of the digital/analog converter, and configured to filter predetermined frequency components from the analog modulation signal.

12. The frequency modulator of claim 8, wherein the digital frequency modulator is configured to output the modulation signal as a complex modulation signal having an in-phase component and a quadrature component associated therewith.

13. The frequency modulator of claim 8, further comprising a delta-sigma modulator coupled between the linking element and the divider circuit, and configured to receive a signal that is a function of the modulation data and the pre-selection signal from the linking element and generate the division control signal in response thereto.

14. The frequency modulator of claim 13, wherein the division control signal facilitates a fractional division of the transmission frequency modulation signal within the divider circuit.

* * * * *